US00RE46660E

(19) United States
(12) Reissued Patent
Sato

(10) Patent Number: US RE46,660 E
(45) Date of Reissued Patent: Jan. 2, 2018

(54) SOLID STATE IMAGING APPARATUS WITH A SHARED DRAIN DIFFUSION LAYER BY ADJACENT CELLS

(71) Applicant: KABUSHIKI KAISHA TOSHIBA, Tokyo (JP)

(72) Inventor: Maki Sato, Kanagawa (JP)

(73) Assignee: Kabushiki Kaisha Toshiba, Tokyo (JP)

(21) Appl. No.: 14/808,999

(22) Filed: Jul. 24, 2015

Related U.S. Patent Documents

Reissue of:
(64) Patent No.: 8,760,546
Issued: Jun. 24, 2014
Appl. No.: 13/370,710
Filed: Feb. 10, 2012

(30) Foreign Application Priority Data

Mar. 3, 2011 (JP) ..... 2011-046478

(51) Int. Cl.

| | |
|---|---|
| ***H04N 5/335*** | (2011.01) |
| ***H04N 3/14*** | (2006.01) |
| ***H01L 27/146*** | (2006.01) |
| ***H04N 5/3745*** | (2011.01) |
| ***H04N 5/345*** | (2011.01) |
| ***H04N 5/347*** | (2011.01) |

(52) U.S. Cl.
CPC .. *H01L 27/14641* (2013.01); *H01L 27/14603* (2013.01); *H01L 27/14612* (2013.01); *H04N 5/347* (2013.01); *H04N 5/3452* (2013.01); *H04N 5/37457* (2013.01)

(58) Field of Classification Search
CPC ..... H01L 27/14603; H01L 27/14612; H01L 27/14641; H04N 5/3452; H04N 5/347; H04N 5/37457
See application file for complete search history.

(56) References Cited

U.S. PATENT DOCUMENTS

| | | | | |
|---|---|---|---|---|
| 7,429,722 | B2 * | 9/2008 | Sekine et al. | 250/208.1 |
| 7,764,315 | B2 * | 7/2010 | Theuwissen | 348/308 |
| 8,314,870 | B2 * | 11/2012 | Itonaga et al. | 348/300 |
| 2001/0023095 | A1 * | 9/2001 | Kopley | H01L 21/761 438/200 |
| 2004/0113151 | A1 * | 6/2004 | Sekine | H01L 27/14609 257/72 |

(Continued)

FOREIGN PATENT DOCUMENTS

| | | |
|---|---|---|
| JP | 2005-142251 | 6/2005 |
| JP | 2005-142251 A | 6/2005 |

(Continued)

OTHER PUBLICATIONS

Office Action dated Jun. 18, 2013 in Japanese Patent Application No. 2011-046478 with English language translation.

*Primary Examiner* — Yuzhen Ge
(74) *Attorney, Agent, or Firm* — Finnegan, Henderson, Farabow, Garrett & Dunner, L.L.P.

(57) ABSTRACT

While a drain power source of a reset transistor and a drain power source of an amplifying transistor are separated, the load of drain power source can be reduced by sharing a drain diffusion layer of the reset transistor and a drain diffusion layer of the amplifying transistor by adjacent cells in sharing pixel units. Further, an efficient pixel layout is provided by reducing the number of routing wires.

37 Claims, 12 Drawing Sheets

(56) References Cited

U.S. PATENT DOCUMENTS

| | | | | |
|---|---|---|---|---|
| 2004/0159861 | A1* | 8/2004 | Mori | H01L 27/14609 257/223 |
| 2005/0263804 | A1* | 12/2005 | Yoshihara | H01L 27/1463 257/291 |
| 2006/0028569 | A1* | 2/2006 | Sekine | 348/308 |
| 2006/0081887 | A1* | 4/2006 | Lyu | H01L 27/14603 257/215 |
| 2006/0131624 | A1* | 6/2006 | Katsuno | H01L 27/14689 257/292 |
| 2006/0208163 | A1* | 9/2006 | Manabe et al. | 250/208.1 |
| 2008/0277702 | A1* | 11/2008 | Katsuno | H01L 27/14603 257/292 |
| 2009/0021625 | A1* | 1/2009 | Sowa | H04N 3/155 348/308 |
| 2009/0295965 | A1* | 12/2009 | Cheung et al. | 348/308 |
| 2010/0002117 | A1* | 1/2010 | Iwane et al. | 348/308 |
| 2010/0097508 | A1* | 4/2010 | Yanagita et al. | 348/301 |
| 2010/0188541 | A1* | 7/2010 | Mabuchi et al. | 348/302 |
| 2011/0297814 | A1* | 12/2011 | Nakayama | H04N 5/37457 250/208.1 |
| 2012/0228474 | A1* | 9/2012 | Sato | 250/208.1 |

FOREIGN PATENT DOCUMENTS

| | | | |
|---|---|---|---|
| JP | 2006-302970 | | 11/2006 |
| JP | 2006-302970 | A | 11/2006 |
| JP | 2008-124237 | | 5/2008 |
| JP | 2008-124237 | A | 5/2008 |
| JP | 2010-103667 | | 5/2010 |
| JP | 2010-103667 | A | 5/2010 |
| JP | 2010-141638 | A | 6/2010 |

* cited by examiner

SOLID STATE IMAGING APPARATUS WITH A SHARED DRAIN DIFFUSION LAYER BY ADJACENT CELLS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This [application] *is a reissue of U.S. Pat. No. 8,760,546, issued on Jun. 24, 2014 from U.S. patent application Ser. No. 13/370,710, which* is based upon and claims the benefit of priority from Japanese Patent Application No. 2011-046478, filed on Mar. 3, 2011[; the]. *The* entire contents of [which] *the above-identified applications* are incorporated herein by reference.

FIELD

Embodiments described herein relate generally to a solid state imaging apparatus.

BACKGROUND

In a CMOS image sensor seeking pixel miniaturization by adopting a multi-pixel shared structure, a method of reducing a drive load of pixels by installing a power source of each drain of a reset transistor and an amplifying transistor of the CMOS image sensor as a separate power source is known.

According to this method, compared with a case when the drain power source of the reset transistor and the drain power source of the amplifying transistor are driven by the same source, a capacity load of a vertical signal line becomes smaller so that a high-speed operation can be performed. In this method, however, a pulse enters the reset transistor of all pixels at the same time to drive the reset transistor and thus, the load of the drain power source of the reset transistor may become large.

The present patent is a patent that solves the above problem and further relates to an efficient pixel layout by sharing a drain diffusion layer of the reset transistor and a drain diffusion layer of the amplifying transistor by adjacent cells in different pixel sharing units to reduce the number of routing wires.

DETAILED DESCRIPTION

In general, according to a solid state imaging apparatus in an embodiment, a cell, an amplifying transistor, a reset transistor, and a row scanning circuit are provided. The cell is provided with K (K is an integer equal to 2 or greater) pixels. The amplifying transistor is shared by the K pixels in the cell and amplifies a signal read from the pixels. The reset transistor is shared by the K pixels in the cell and resets a signal read from the pixels. The row scanning circuit drives the drains of the reset transistors in different rows separately.

Solid state imaging apparatuses according to the embodiments will be described below with reference to drawings. However, the present invention is not limited by these embodiments.

(First Embodiment)

Figure 1:
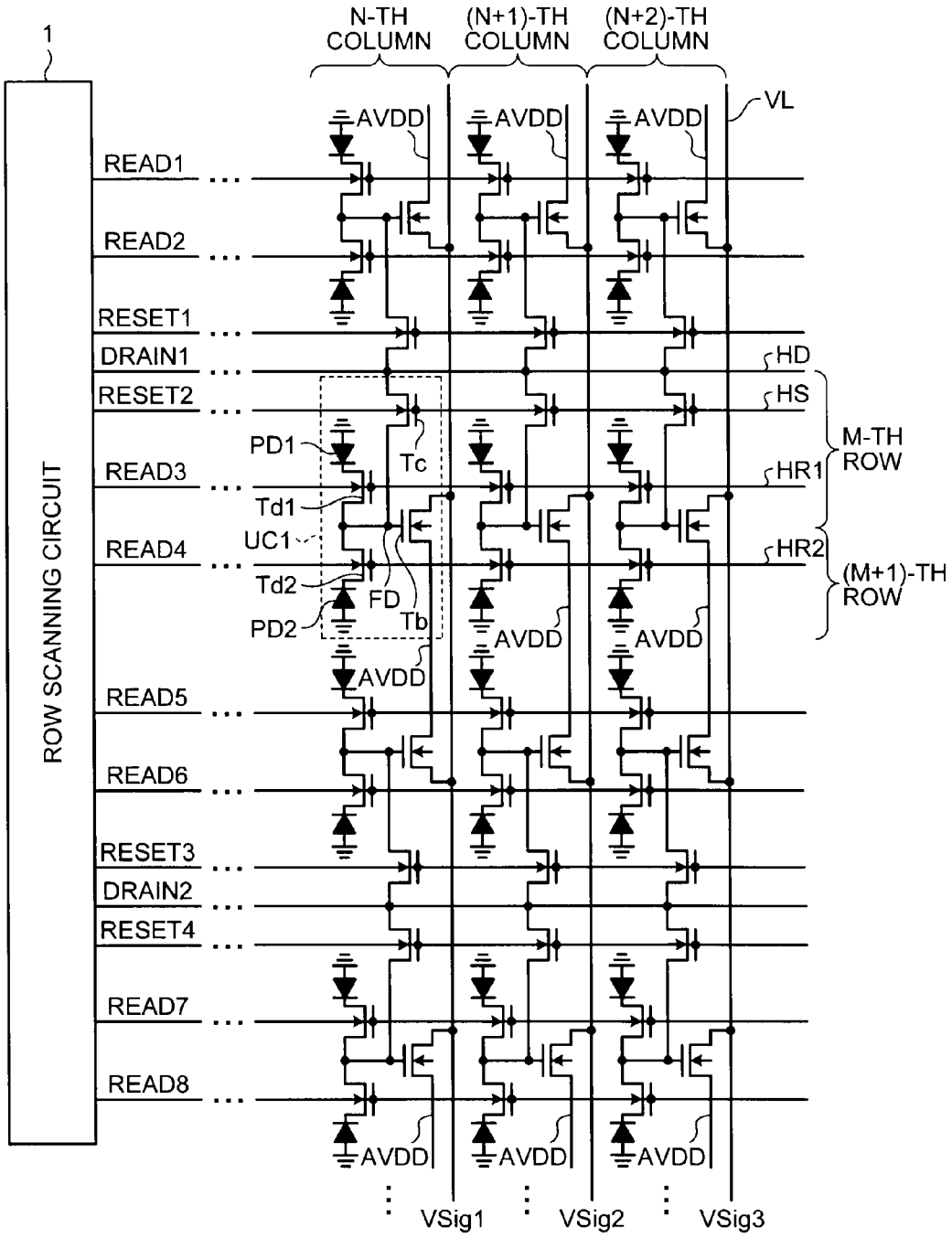
FIG. 1 is a block diagram illustrating an outline configuration of a solid state imaging apparatus according to a first embodiment.

FIG. 1 is a block diagram illustrating an outline configuration of a solid state imaging apparatus according to a first embodiment.

In FIG. 1, the solid state imaging apparatus has a cell UC1 arranged in a matrix form in a row direction and a column direction. The cell UC1 is provided with two photodiodes PD1, PD2, two read transistors Td1, Td2, one reset transistor Tc, one floating diffusion FD, and one amplifying transistor Tb.

Each of the photodiodes PD1, PD2 can convert light from an object to be imaged into an electric signal in units of pixel. The read transistors Td1, Td2 can read a signal photoelectrically converted by the photodiodes PD1, PD2 respectively. The reset transistor Tc is shared by the photodiodes PD1, PD2 and can reset a signal read from the photodiodes PD1, PD2. The floating diffusion FD is shared by the photodiodes PD1, PD2 and can cause detection of a signal read from the photodiodes PD1, PD2. The amplifying transistor Tb is shared by the photodiodes PD1, PD2 and can amplify a signal read from the photodiodes PD1, PD2.

The photodiodes PD1, PD2 are vertically arranged side by side and the photodiode PD1 can be arranged in an M (M is a positive integer)-th row and the photodiode PD2 can be arranged in an (M+1)-th row. The floating diffusion FD is shared by the drains of the read transistors Td1, Td2. Sources of the read transistors Td1, Td2 are connected to the photodiodes PD1, PD2 respectively. The source of the reset transistor Tc is connected to the floating diffusion FD.

The cell UC1 is arranged in such a way that a mirror image is formed with respect to cells adjacent to each other in the vertical direction. The drain of the reset transistor Tc and the drain of the amplifying transistor Tb of the cell UC1 are shared by different cells adjacent to each other in the vertical direction. For example, the drain of the reset transistor Tc can be made to be shared with the adjacent cell above the cell UC1 and the drain of the amplifying transistor Tb can be made to be shared with the adjacent cell below the cell UC1.

The solid state imaging apparatus is provided with a row scanning circuit 1 that scans pixels in units of row and also a vertical signal line VL that transmits a signal read from each pixel in units of column. A drain power source line HD, a reset control line HS, and read control lines HR1, HR2 are connected to the row scanning circuit 1. The read control lines HR1, HR2 are provided for each row and connected to the read transistors Td1, Td2 respectively. The reset control line HS is provided for every two rows and connected to the gate of the reset transistor Tc. The two reset control lines HS can be arranged adjacent to each other for every four pixels in the vertical direction. The drain power source line HD is provided for every four rows and connected to the gate of the reset transistor Tc. The drain power source line HD can be arranged between the two reset control lines HS arranged adjacent to each other. The row scanning circuit 1 can drive the drains of the reset transistors Tc in different rows separately. The row scanning circuit 1 can also drive the drain of the reset transistor Tc and the drain of the amplifying transistor Tb separately. For example, the row scanning circuit 1 can drive the drain of the reset transistor Tc from row to row. However, if the drain of the reset transistor Tc is shared by two pixels adjacent to each other in the vertical direction, the drain of the reset transistor Tc can be driven for every two rows. If the drain of the reset transistor Tc is shared by four pixels adjacent to each other in the vertical direction, the drain of the reset transistor Tc can be driven for every four rows.

The gate of the amplifying transistor Tb is connected to the floating diffusion FD, the source of the amplifying transistor Tb is connected to the vertical signal line VL, and the drain of the amplifying transistor Tb is connected to a drain power source AVDD.

The drain power source AVDD can commonly be connected to the drains of the amplifying transistors Tb of all the cells UC1 in the solid state imaging apparatus. The voltage of the drain power source AVDD can be set to a fixed value.

Figure 2:
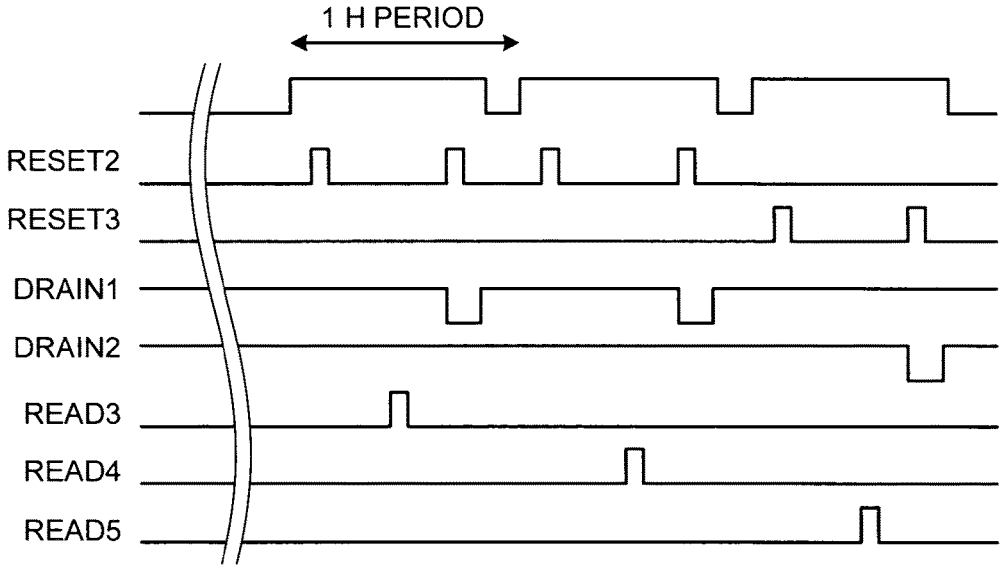
FIG. 2 is a timing chart illustrating a read operation of the solid state imaging apparatus in FIG. 1.

FIG. 2 is a timing chart illustrating a read operation of the solid state imaging apparatus in FIG. 1.

In FIG. 2, if, for example, signals are to be read from pixels in the M-th row, the reset transistor Tc is turned on and a charge of the floating diffusion FD is reset by a reset signal RESET2 being provided to the reset control line HS. Then, with the voltage in accordance with a reset level of the floating diffusion FD being applied to the gate of the amplifying transistor Tb and the voltage applied to the gate of the amplifying transistor Tb being followed by the voltage of the vertical signal line VL in an N (N is a positive integer)-th column, a pixel signal VSig1 of the reset level is output to the vertical signal line VL in the N-th column. Incidentally, the amplifying transistor Tb can configure a source follower together with a load transistor connected to the vertical signal line VL.

Next, the read transistor Td1 is turned on by a read signal READ3 being provided to the read control line HR1 and a charge detected by the photodiode PD1 is transferred to the floating diffusion FD. Then, with the voltage in accordance with a signal level of the floating diffusion FD being applied to the gate of the amplifying transistor Tb and the voltage applied to the gate of the amplifying transistor Tb being followed by the voltage of the vertical signal line VL in the N-th column, the pixel signal VSig1 of the signal level is output to the vertical signal line VL in the N-th column.

Next, the reset transistor Tc is turned on by the reset signal RESET2 being provided to the reset control line HS. At this point, the potential of the floating diffusion FD is set to an L level by a drain pulse DRAIN1 being provided to the drain power source line HD in the M-th row.

If the potential of the floating diffusion FD is set to the L level, the amplifying transistor Tb is turned off and each pixel is cut off from the vertical signal line VL. Thus, after the signal from each pixel being read, the vertical signal line VL can be prevented from being driven based on a signal from a pixel other than the pixels to be read by setting the potential of the floating diffusion FD of the cell UC1 to the potential of the power source.

By driving the drain power source line HD separately in different rows, the load of the drain power source of the reset transistor Tc can be reduced.

Also, the capacity load of the vertical signal line VL can be reduced by separating the drain power source line HD from the drain power source AVDD so that a high-speed operation can be realized and also the drain potential of the amplifying transistor Tb can be fixed, leading to reduced noise by minimizing fluctuations in potential of the vertical signal line VL.

By making different cells adjacent to each other in the vertical direction share the drain of the reset transistor Tc and the drain of the amplifying transistor Tb of the cell UC1, the layout area can be reduced while pixels in the horizontal direction and the vertical direction enabling to be equally spaced.

Also by making cells adjacent to each other in the vertical direction share the drain of the reset transistor Tc of the cell UC1, cells adjacent to each other in the vertical direction can be made to share the drain power source line HD so that the number of the drain power source lines HD can be reduced by half.

Figure 3:
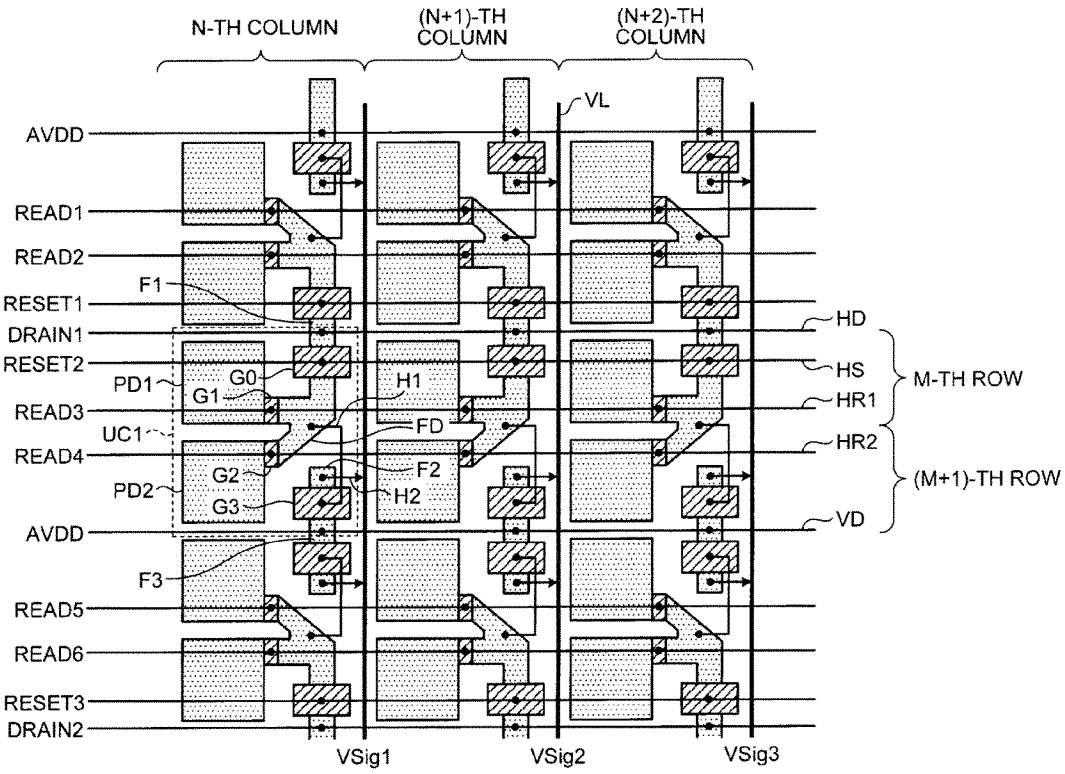
FIG. 3 is a plan view illustrating a layout configuration of a pixel array unit of the solid state imaging apparatus in FIG. 1.

FIG. 3 is a plan view illustrating a layout configuration of a pixel array unit of the solid state imaging apparatus in FIG. 1.

In FIG. 3, the two photodiodes PD1, PD2 are vertically arranged side by side in units of the cell UC1 on a semiconductor substrate. Then, the floating diffusion FD is arranged adjacent to the photodiodes PD1, PD2.

A gate electrode G1 is arranged between the photodiode PD1 and the floating diffusion FD and a gate electrode G2 is arranged between the photodiode PD2 and the floating diffusion FD. The gate electrodes G1, G2 can configure the read transistors Td1, Td2 respectively.

An impurity diffusion layer F1 is arranged in a boundary region with the adjacent cell on the upper side and a gate electrode G0 is arranged between the floating diffusion FD and the impurity diffusion layer F1. The gate electrode G0 can configure the reset transistor Tc.

An impurity diffusion layer F2 is arranged adjacent to the floating diffusion FD in the vertical direction and an impurity diffusion layer F3 is arranged adjacent to the impurity diffusion layer F2 in the vertical direction. A gate electrode G3 is arranged between the impurity diffusion layers F2, F3. The gate electrode G3 can configure the amplifying transistor Tb.

The reset transistor Tc and the amplifying transistor Tb of the cell UC1 are arranged between the photodiodes PD1, PD2 in the N-th column and the photodiodes PD1, PD2 in the (N+1)-th column.

The floating diffusion FD is connected to the gate electrode G3 via a wire H1. The impurity diffusion layer F2 is connected to the vertical signal line VL via a wire H2. The drain power source line HD is connected to the impurity diffusion layer F1.

The reset control line HS is connected to the gate electrode G0. The read control lines HR1, HR2 are connected to the gate electrodes G1, G2 respectively. A power source line VD is connected to the impurity diffusion layer F3. The power source line VD can supply the drain power source AVDD.

Incidentally, the read transistors Td1, Td2, the reset transistor Tc, the floating diffusion FD, and the amplifying transistor Tb are arranged on the front side of the semiconductor substrate and the photodiodes PD1, PD2 are arranged on the back side of the semiconductor substrate. For such a back-side illumination type, wires such as the reset control line HS, the read control lines HR1, HR2, and the power source line VD can be arranged overlapping with the photodiodes PD1, PD2 so that flexibility of the wire layout can be increased.

Incidentally, the photodiodes PD1, PD2 may also be arranged on the front side of the semiconductor substrate together with the read transistors Td1, Td2, the reset transistor Tc, the floating diffusion FD, and the amplifying transistor Tb. For such a front-side illumination type, wires of the reset control line HS, the read control lines HR1, HR2, and the power source line VD can be arranged while avoiding the photodiodes PD1, PD2 so that the incidence of light into the photodiodes PD1, PD2 is not prevented.

By making the drain diffusion layer of the reset transistor Tc of the cell UC1 and the drain diffusion layer of the reset transistor Tc of the adjacent cell on the upper side shared and the drain diffusion layer of the amplifying transistor Tb of the cell UC1 and the drain diffusion layer of the amplifying transistor Tb of the adjacent cell on the lower side shared, the layout area can be reduced while pixels in the horizontal direction and the vertical direction enabling to be equally spaced.

(Second Embodiment)

Figure 4:
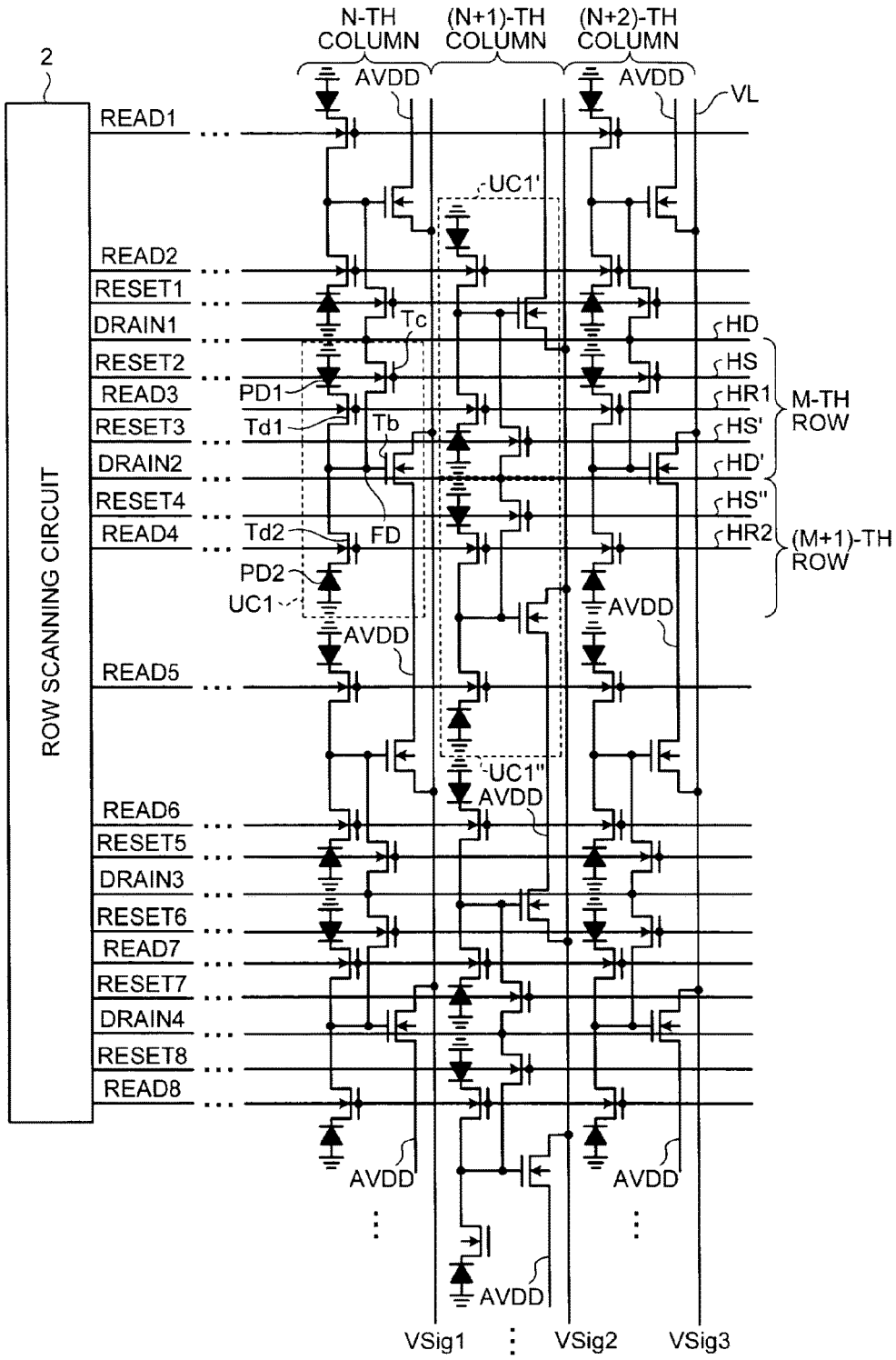
FIG. 4 is a block diagram illustrating the outline configuration of a solid state imaging apparatus according to a second embodiment.

FIG. 4 is a block diagram illustrating the outline configuration of a solid state imaging apparatus according to a second embodiment.

In FIG. 4, the solid state imaging apparatus has a cell UC1 arranged in a matrix form in the row direction and the column direction. The configuration of the cell UC1 in FIG. 4 is similar to the configuration of the cell UC1 in FIG. 1. However, a cell UC1' in the (N+1)-th column in FIG. 4 is arranged by being shifted upward in the vertical direction by one pixel with respect to the cell UC1 in the N-th column and a cell UC1" in the (N+1)-th column in FIG. 4 is arranged by being shifted downward in the vertical direction by one pixel with respect to the cell UC1 in the N-th column.

A drain power source line HD' and a reset control line HS' are provided in the cell UC1' in the (N+1)-th column separately from the drain power source line HD and the reset control line HS of the cell UC1 in the N-th column. In addition, the drain power source line HD' and a reset control line HS" are provided in the cell UC1" in the (N+1)-th column separately from the drain power source line HD1 and the reset control line HS1 of the cell UC1 in the N-th column. The drain power source line HD' is shared by the cells UC1', UC1".

The reset control line HS' is connected to the gate of the reset transistor Tc of the cell UC1' in the (N+1)-th column. The reset control line HS" is connected to the gate of the reset transistor Tc of the cell UC1" in the (N+1)-th column. The drain power source line HD' is connected to the drains of the reset transistors Tc of the cells UC1', UC1" in the (N+1)-th column.

In the cell UC1' in the (N+1)-th column, the read control line HR1 is connected to the gate of the read transistor Td2 and the read control line HR2 is connected to the gate of the read transistor Td1.

In this solid state imaging apparatus, instead of the row scanning circuit 1 in FIG. 1, a row scanning circuit 2 is provided. The drain power source lines HD, HD', the reset control lines HS, HS', HS", and the read control lines HR1, HR2 are connected to the row scanning circuit 2. The row scanning circuit 2 can drive the drains of the reset transistors Tc from row to row separately from the drain of the amplifying transistor Tb. When a signal is read from a pixel in the M-th row, the drain power source lines HD, HD' can be driven as a set.

Figure 5:
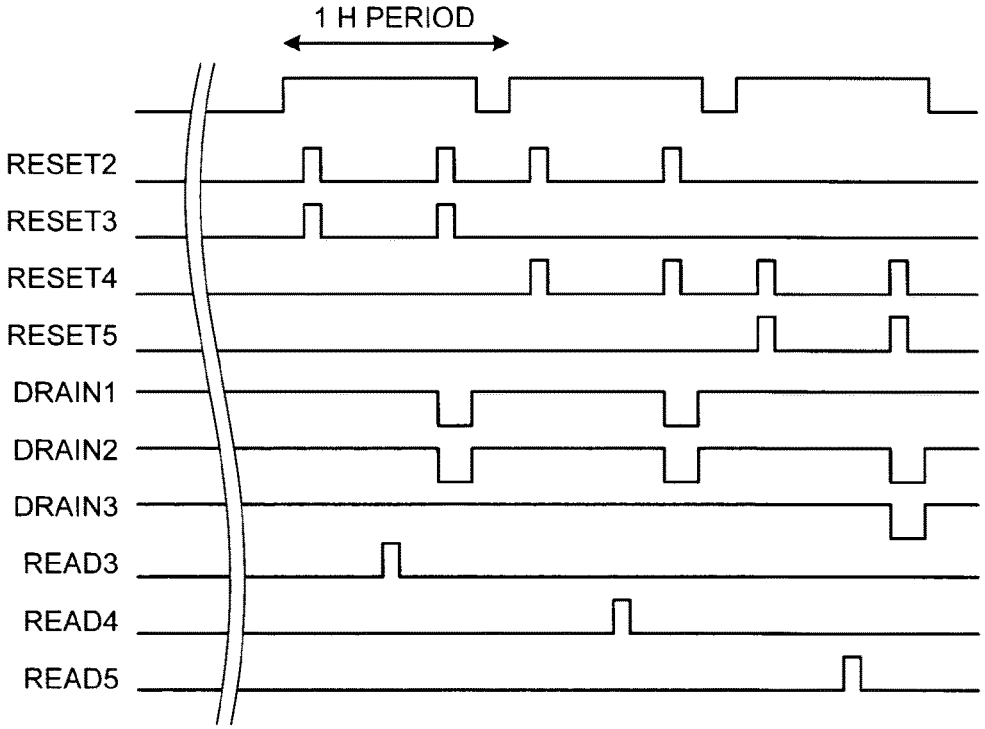
FIG. 5 is a timing chart illustrating the read operation of the solid state imaging apparatus in FIG. 4.

FIG. 5 is a timing chart illustrating the read operation of the solid state imaging apparatus in FIG. 4.

In FIG. 5, if, for example, a signal is to be read from a pixel in the N-th column and the M-th row, the reset transistor Tc of the cell UC1 is turned on and a charge of the floating diffusion FD of the cell UC1 is reset by a reset signal RESET2 being provided to the reset control line HS. Then, with the voltage in accordance with the reset level of the floating diffusion FD of the cell UC1 being applied to the gate of the amplifying transistor Tb of the cell UC1 and the voltage applied to the gate of the amplifying transistor Tb of the cell UC1 being followed by the voltage of the vertical signal line VL in the N-th column, the pixel signal VSig1 of the reset level is output to the vertical signal line VL in the N-th column.

At this point, the reset transistor Tc of the cell UC1' is turned on and a charge of the floating diffusion FD of the cell UC1' is reset by a reset signal RESET3 being provided to the reset control line HS'. Then, with the voltage in accordance with the reset level of the floating diffusion FD of the cell UC1' being applied to the gate of the amplifying transistor Tb of the cell UC1' and the voltage applied to the gate of the amplifying transistor Tb of the cell UC1' being followed by the voltage of the vertical signal line VL in the (N+1)-th column, a pixel signal VSig2 of the reset level is output to the vertical signal line VL in the (N+1)-th column.

Next, the read transistor Td1 of the cell UC1 is turned on by the read signal READ3 being provided to the read control line HR1 and a charge detected by the photodiode PD1 of the cell UC1 is transferred to the floating diffusion FD of the cell UC1. Then, with the voltage in accordance with the signal level of the floating diffusion FD of the cell UC1 being applied to the gate of the amplifying transistor Tb of the cell UC1 and the voltage applied to the gate of the amplifying transistor Tb of the cell UC1 being followed by the voltage of the vertical signal line VL in the N-th column, the pixel signal VSig1 of the signal level is output to the vertical signal line VL in the N-th column.

Also, the read transistor Td2 of the cell UC1' is turned on by the read signal READ3 being provided to the read control line HR1 and a charge detected by the photodiode PD2 of the cell UC1' is transferred to the floating diffusion FD of the cell UC1'. Then, with the voltage in accordance with the signal level of the floating diffusion FD of the cell UC1' being applied to the gate of the amplifying transistor Tb of the cell UC1' and the voltage applied to the gate of the amplifying transistor Tb of the cell UC1' being followed by the voltage of the vertical signal line VL in the (N+1)-th column, the pixel signal VSig2 of the signal level is output to the vertical signal line VL in the (N+1)-th column.

Next, the reset transistor Tc of the cell UC1 is turned on by the reset signal RESET2 being provided to the reset control line HS. At this point, the potential of the floating diffusion FD of the cell UC1 is set to the L level by the drain pulse DRAIN1 being provided to the drain power source line HD.

Also, the reset transistor Tc of the cell UC1' is turned on by the reset signal RESET3 being provided to the reset control line HS'. At this point, the potential of the floating diffusion FD of the cell UC1' is set to the L level by a drain pulse DRAIN2 being provided to the drain power source line HD'.

Next, if a signal is to be read from a pixel in the N-th column and the M-th row, the reset transistor Tc of the cell UC1 is turned on and a charge of the floating diffusion FD of the cell UC1 is reset by the reset signal RESET2 being provided to the reset control line HS. Then, with the voltage in accordance with the reset level of the floating diffusion FD of the cell UC1 being applied to the gate of the amplifying transistor Tb and the voltage applied to the gate of the amplifying transistor Tb of the cell UC1 being followed by the voltage of the vertical signal line VL in the N-th column, the pixel signal VSig1 of the reset level is output to the vertical signal line VL in the N-th column.

At this point, the reset transistor Tc of the cell UC1" is turned on and a charge of the floating diffusion FD of the cell UC1" is reset by a reset signal RESET4 being provided to the reset control line HS". Then, with the voltage in accordance with the reset level of the floating diffusion FD of the cell UC1" being applied to the gate of the amplifying transistor Tb of the cell UC1" and the voltage applied to the gate of the amplifying transistor Tb of the cell UC1" being followed by the voltage of the vertical signal line VL in the (N+1)-th column, the pixel signal VSig2 of the reset level is output to the vertical signal line VL in the (N+1)-th column.

Next, the read transistor Td2 of the cell UC1 is turned on by a read signal READ4 being provided to the read control line HR2 and a charge detected by the photodiode PD2 of the cell UC1 is transferred to the floating diffusion FD of the cell UC1. Then, with the voltage in accordance with the signal level of the floating diffusion FD of the cell UC1 being applied to the gate of the amplifying transistor Tb of the cell UC1 and the voltage applied to the gate of the amplifying transistor Tb of the cell UC1 being followed by the voltage of the vertical signal line VL in the N-th column, the pixel signal VSig1 of the signal level is output to the vertical signal line VL in the N-th column.

Also, the read transistor Td1 of the cell UC1" is turned on by the read signal READ4 being provided to the read control line HR2 and a charge detected by the photodiode PD1 of the cell UC1" is transferred to the floating diffusion FD of the cell UC1". Then, with the voltage in accordance with the signal level of the floating diffusion FD of the cell UC1" being applied to the gate of the amplifying transistor Tb of the cell UC1" and the voltage applied to the gate of the amplifying transistor Tb of the cell UC1" being followed by the voltage of the vertical signal line VL in the (N+1)-th column, the pixel signal VSig2 of the signal level is output to the vertical signal line VL in the (N+1)-th column.

Next, the reset transistor Tc of the cell UC1 is turned on by the reset signal RESET2 being provided to the reset control line HS. At this point, the potential of the floating diffusion FD of the cell UC1 is set to the L level by the drain pulse DRAIN1 being provided to the drain power source line HD.

Also, the reset transistor Tc of the cell UC1" is turned on by the reset signal RESET4 being provided to the reset control line HS". At this point, the potential of the floating diffusion FD of the cell UC1" is set to the L level by the drain pulse DRAIN2 being provided to the drain power source line HD'.

Hereafter, a similar operation is caused when signals are read from the next row.

The layout of greens can be made symmetrical by arranging cells being shifted in the vertical direction between the N-th column and the (N+1)-th column so that variations in color can be reduced.

Figure 6:
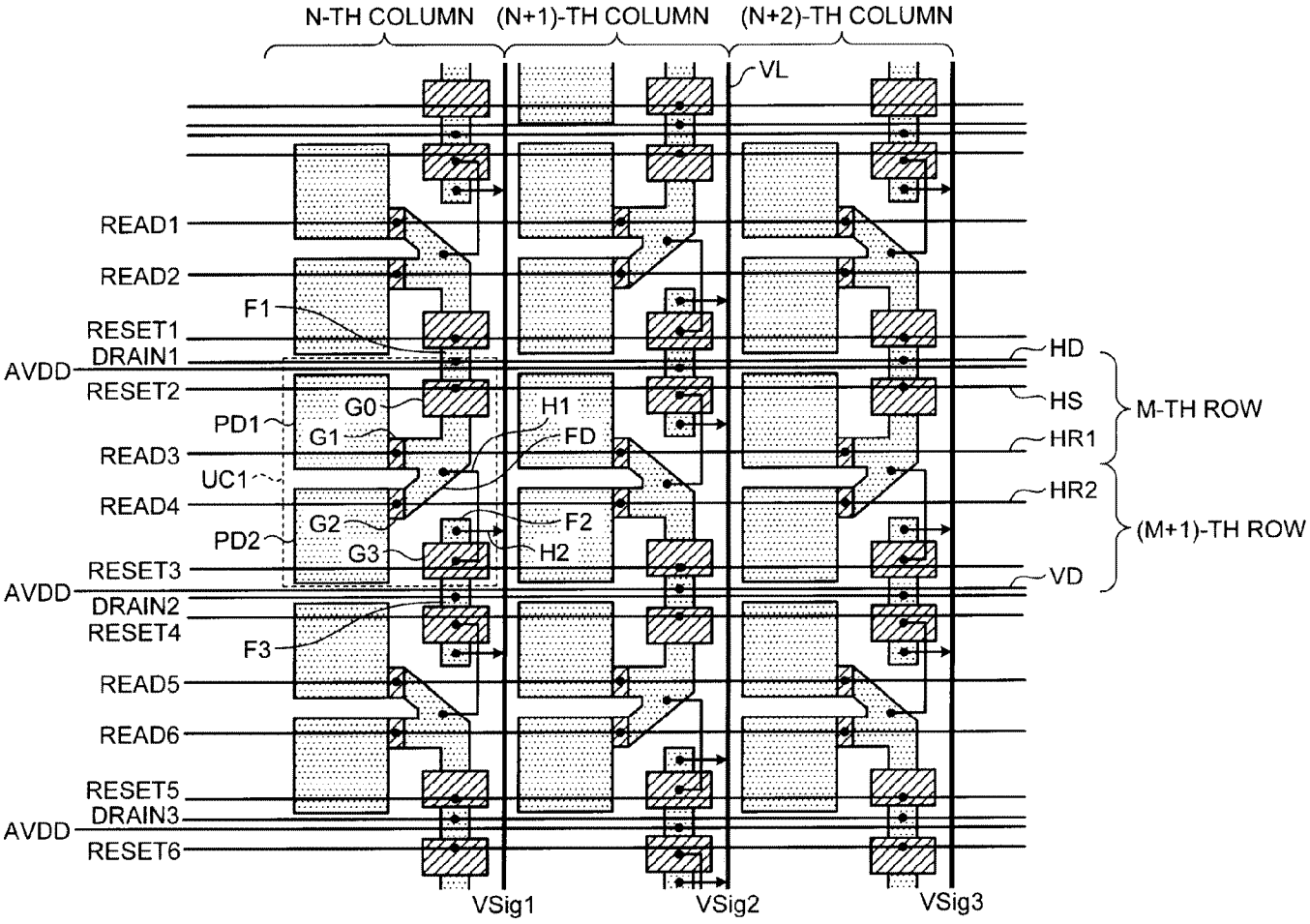
FIG. 6 is a plan view illustrating the layout configuration of a pixel array unit of the solid state imaging apparatus in FIG. 4.

FIG. 6 is a plan view illustrating the layout configuration of a pixel array unit of the solid state imaging apparatus in FIG. 4.

In FIG. 6, the layout configuration of the cell UC1 of the solid state imaging apparatus is similar to the layout configuration in FIG. 3. However, the reset transistor Tc, the floating diffusion FD, and the amplifying transistor Tb of the cell UC1 in the (N+1)-th column are arranged by being shifted in the vertical direction by two pixels with respect to the reset transistor Tc, the floating diffusion FD, and the amplifying transistor Tb of the cell UC1 in the N-th column.

Accordingly, even if the cell UC1 is arranged in a staggered configuration, by making the drain diffusion layer of the reset transistor Tc of the cell UC1 and the drain diffusion layer of the reset transistor Tc of the adjacent cell on the upper side shared and the drain diffusion layer of the amplifying transistor Tb of the cell UC1 and the drain diffusion layer of the amplifying transistor Tb of the adjacent cell on the lower side shared, the layout area can be reduced while pixels in the horizontal direction and the vertical direction enabling to be equally spaced.

In the example of FIG. 6, the wire layout of a back-side illumination type CMOS sensor is taken as an example, but the present embodiment may also be applied to a front-side illumination type CMOS sensor.

(Third Embodiment)

Figure 7:
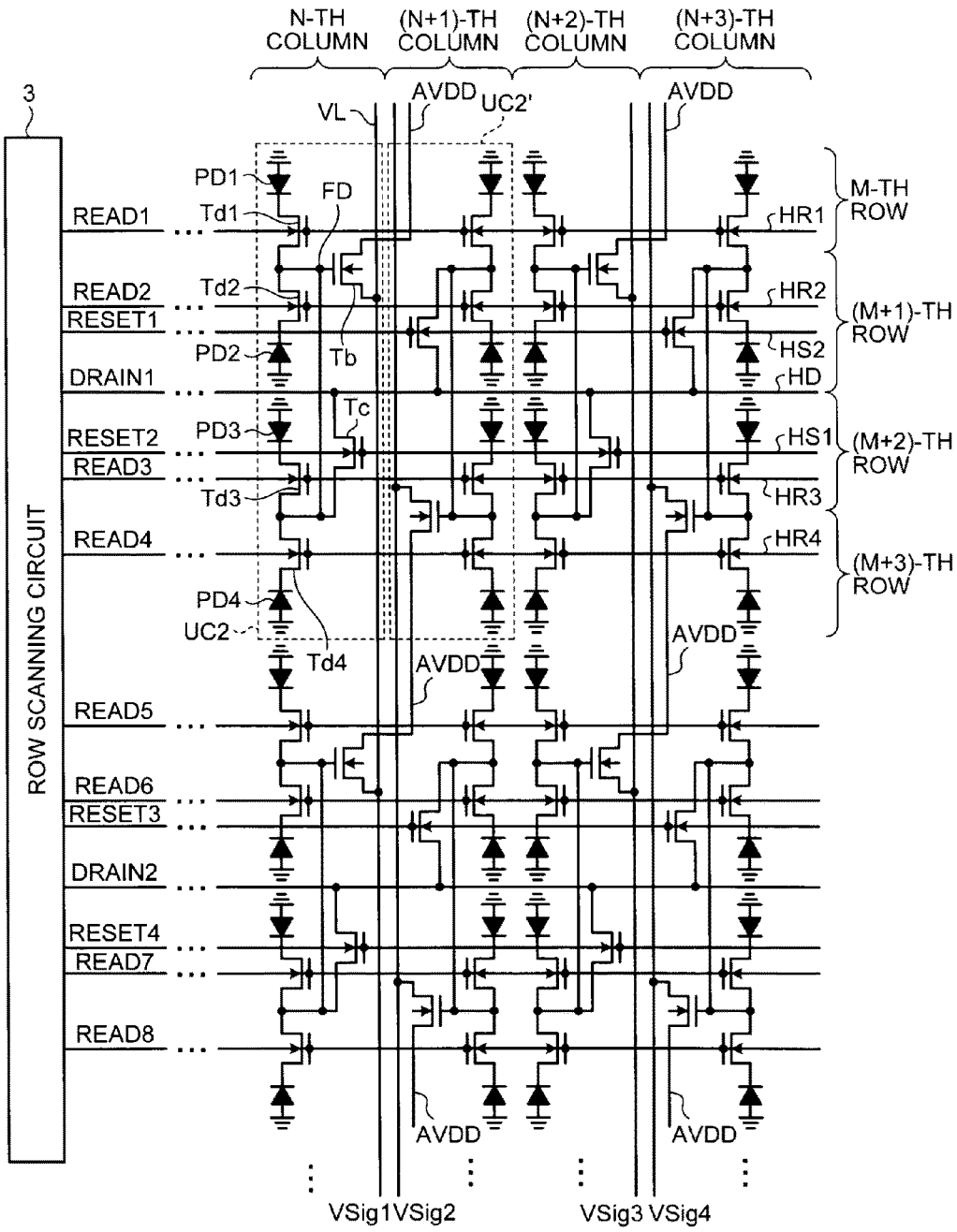
FIG. 7 is a block diagram illustrating the outline configuration of a solid state imaging apparatus according to a third embodiment.

FIG. 7 is a block diagram illustrating the outline configuration of a solid state imaging apparatus according to a third embodiment.

In FIG. 7, the solid state imaging apparatus has a cell UC2 arranged in a matrix form in the row direction and the column direction. Each of the cells UC2 is provided with four photodiodes PD1 to PD4, four read transistors Td1 to Td4, one reset transistor Tc, one floating diffusion FD, and one amplifying transistor Tb.

Each of the photodiodes PD1 to PD4 can convert light from an object to be imaged into an electric signal in units of pixel. The read transistors Td1 to Td4 can read a signal photoelectrically converted by the photodiodes PD1 to PD4 respectively. The reset transistor Tc is shared by the photodiodes PD1 to PD4 and can reset a signal read from the photodiodes PD1 to PD4. The floating diffusion FD is shared by the photodiodes PD1 to PD4 and can cause detection of a signal read from the photodiodes PD1 to PD4. The amplifying transistor Tb is shared by the photodiodes PD1 to PD4 and can amplify a signal read from the photodiodes PD1 to PD4.

The photodiodes PD1 to PD4 are vertically arranged side by side and the photodiode PD1 can be arranged in the M-th row, the photodiode PD2 can be arranged in an (M+1)-th row, the photodiode PD3 can be arranged in an (M+2)-th row, and the photodiode PD4 can be arranged in an (M+3)-th row. The floating diffusion FD is shared by the drains of the read transistors Td1, Td2. The sources of the read transistors Td1 to Td4 are connected to the photodiodes PD1 to PD4 respectively. The source of the reset transistor Tc is connected to the floating diffusion FD.

The cell UC2 in the N-th column is arranged point-symmetrically with respect to a cell UC2' in the (N+1)-th column. The drain of the reset transistor Tc of the cell UC2 in the N-th column and the drain of the reset transistor Tc of the cell UC2' in the (N+1)-th column are shared. Also, the drain of the amplifying transistor Tb of the cell UC2 in the N-th column and the drain of the amplifying transistor Tb of the cell UC2' in the (N+1)-th column are shared.

The solid state imaging apparatus is provided with a row scanning circuit 3 that scans pixels in units of row and also a vertical signal line VL that transmits a signal read from each pixel in units of column. A drain power source line HD, reset control lines HS1, HS2, and read control lines HR1 to HR4 are connected to the row scanning circuit 3. The read control lines HR1 to HR4 are provided for each row and connected to the gates of the read transistors Td1 to Td4 respectively. The reset control lines HS1, HS2 are provided for every four rows, the reset control line HS1 is connected to the gate of the reset transistor Tc of the cell UC2 in the N-th column, and the reset control line HS2 is connected to the gate of the reset transistor Tc of the cell UC2' in the (N+1)-th column. The drain power source line HD is provided for every four rows and connected to the gate of the reset transistor Tc. The row scanning circuit 3 can drive the drains of the reset transistors Tc in different rows separately. The row scanning circuit 3 can also drive the drain of the reset transistor Tc and the drain of the amplifying transistor Tb separately. If, for example, the drain of the reset transistor Tc is shared by four pixels adjacent to each other in the vertical direction, the drain of the reset transistor Tc can be driven for every four rows. The row scanning circuit 3 can drive the reset control line HS1 of the cell UC2 in the N-th column and the reset control line HS2 of the cell UC2' in the (N+1)-th column as a set.

The gate of the amplifying transistor Tb is connected to the floating diffusion FD, the source of the amplifying transistor Tb is connected to the vertical signal line VL, and the drain of the amplifying transistor Tb is connected to a drain power source AVDD.

The drain power source AVDD can commonly be connected to the drains of the amplifying transistors Tb of all the cells UC2 in the solid state imaging apparatus. The voltage of the drain power source AVDD can be set to a fixed value.

Figure 8:
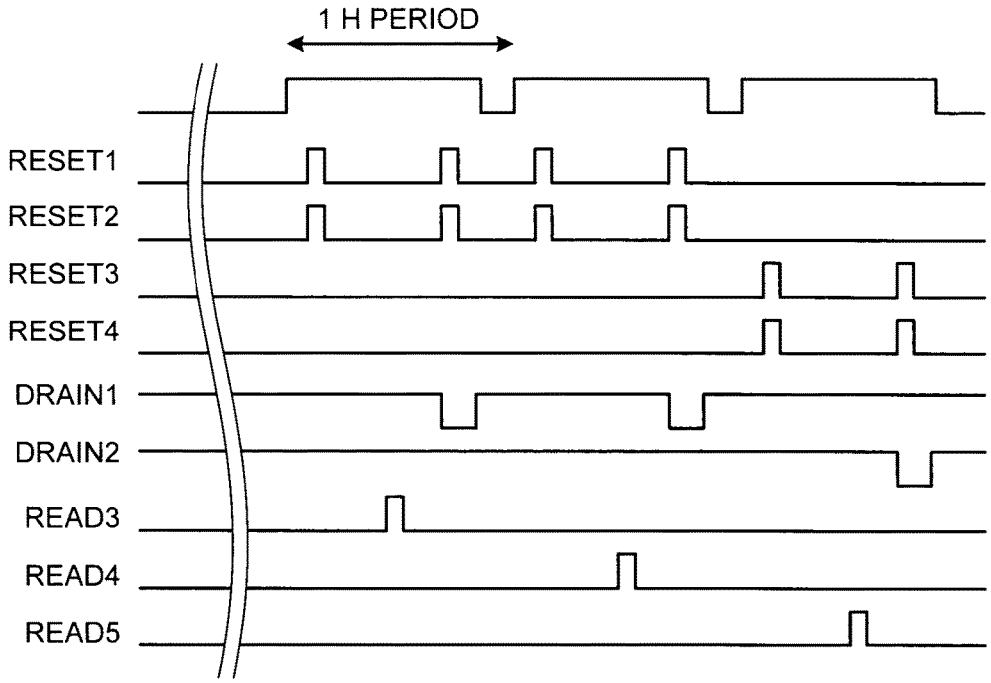
FIG. 8 is a timing chart illustrating the read operation of the solid state imaging apparatus in FIG. 7.

FIG. 8 is a timing chart illustrating the read operation of the solid state imaging apparatus in FIG. 7.

In FIG. 8, if, for example, signals are to be read from pixels in the (M+2)-th row, each of the reset transistors Tc of the cells UC2, UC2' is turned on and a charge of each of the floating diffusions FD of the cells UC2, UC2' is reset by reset signals RESET1, RESET2 being provided to the reset control lines HS1, HS2 respectively. Then, with the voltage in accordance with the reset level of the floating diffusion FD of the cell UC2 being applied to the gate of the amplifying transistor Tb of the cell UC2 and the voltage applied to the gate of the amplifying transistor Tb of the cell UC2 being followed by the voltage of the vertical signal line VL in the N-th column, the pixel signal VSig1 of the reset level is output to the vertical signal line VL in the N-th column.

Next, the read transistor Td3 is turned on by the read signal READ3 being provided to the read control line HR3 and a charge detected by the photodiode PD3 is transferred to the floating diffusion FD. Then, with the voltage in accordance with a signal level of the floating diffusion FD being applied to the gate of the amplifying transistor Tb and the voltage applied to the gate of the amplifying transistor Tb being followed by the voltage of the vertical signal line VL in the N-th column, the pixel signal VSig1 of the signal level is output to the vertical signal line VL in the N-th column.

Next, each of the reset transistors Tc of the cells UC2, UC2' is turned on by the reset signals RESET1, RESET2 being provided to the reset control lines HS1, HS2 respectively. At this point, the potential of the floating diffusion FD is set to the L level by the drain pulse DRAIN1 being provided to the drain power source line HD.

Hereafter, a similar operation is caused when signals are read from the next row.

By driving the drain power source line HD separately in different rows, the load of the drain power source of the reset transistor Tc can be reduced also in the 4-pixel shared structure.

By arranging the cell UC2 in the N-th column point-symmetrically with respect to the cell UC2' in the (N+1)-th column, the drain of the reset transistor Tc and the drain of the amplifying transistor Tb of the cell UC1 can be made to be shared with different adjacent cells while ensuring symmetry of the arrangement of the floating diffusion FD in the vertical direction and the horizontal direction. Therefore, the layout can be set so that parasitic capacitances between the floating diffusions FD are mutually equal to prevent an occurrence of stepwise noise between the cells UC2.

Figure 9:
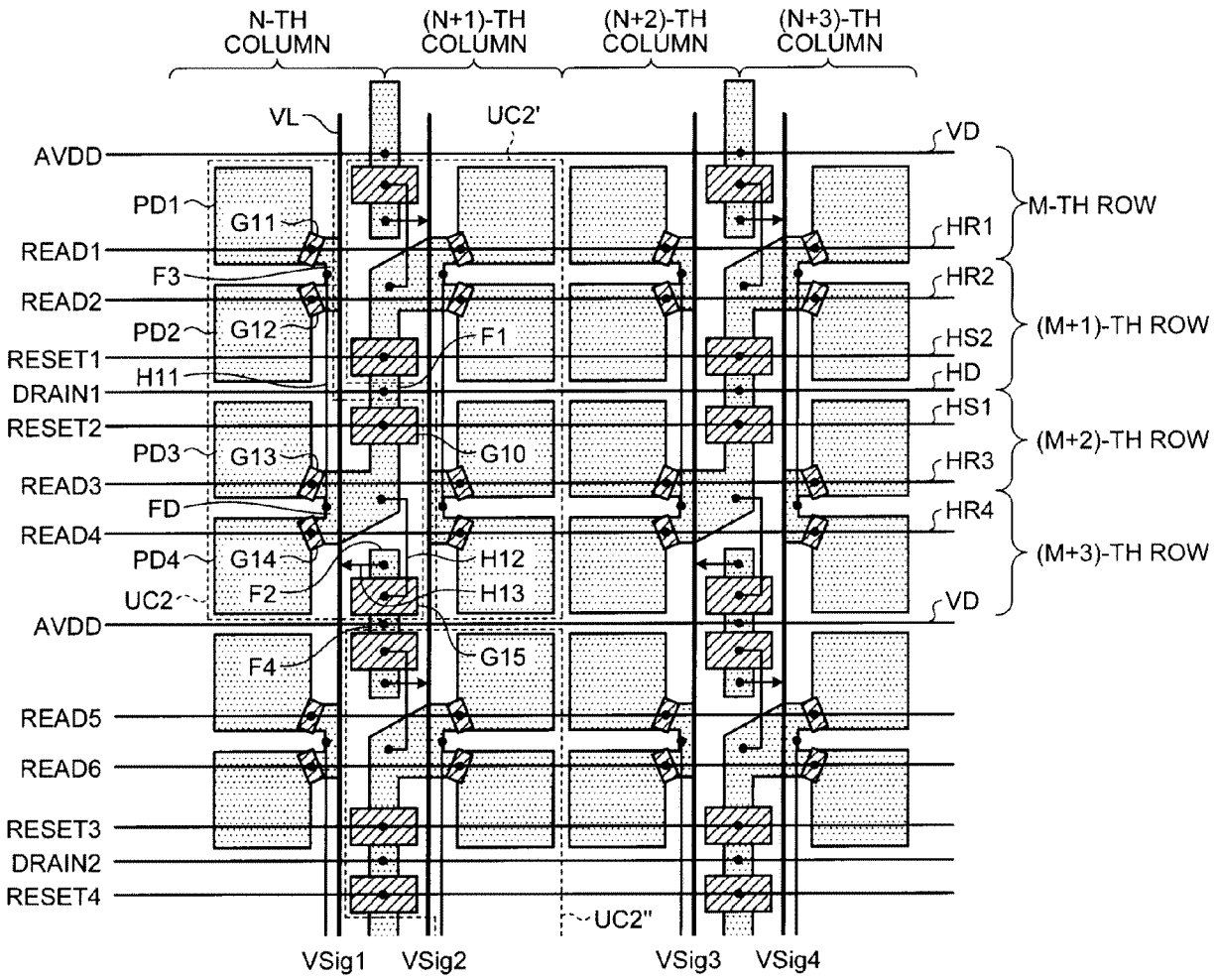
FIG. 9 is a plan view illustrating the layout configuration of a pixel array unit of the solid state imaging apparatus in FIG. 7.

FIG. 9 is a plan view illustrating the layout configuration of a pixel array unit of the solid state imaging apparatus in FIG. 7.

In FIG. 9, the four photodiodes PD1 to PD4 are vertically arranged side by side in units of the cell UC2 on a semiconductor substrate. Then, the impurity diffusion layer F3 is arranged adjacent to the photodiodes PD1, PD2 and the floating diffusion FD is arranged adjacent to the photodiodes PD3, PD4.

A gate electrode G11 is arranged between the photodiode PD1 and the impurity diffusion layer F3, a gate electrode G12 is arranged between the photodiode PD2 and the impurity diffusion layer F3, a gate electrode G13 is arranged between the photodiode PD3 and the floating diffusion FD, and a gate electrode G14 is arranged between the photodiode PD4 and the floating diffusion FD. The gate electrodes G11 to G14 can configure the read transistors Td1 to Td4 respectively.

The impurity diffusion layer F1 is arranged in a boundary region with the adjacent cell UC2' in the horizontal direction and a gate electrode G10 is arranged between the floating diffusion FD and the impurity diffusion layer F1. The gate electrode G10 can configure the reset transistor Tc.

The impurity diffusion layer F2 is arranged adjacent to the floating diffusion FD in the vertical direction and an impurity diffusion layer F4 is arranged in a boundary region with the cell UC2" adjacent to the cell UC2' in the vertical direction. A gate electrode G15 is arranged between the impurity diffusion layers F2, F4. The gate electrode G15 can configure the amplifying transistor Tb. The floating diffusion FD of the cell UC2 and the floating diffusion FD of the cell UC2' are arranged point-symmetrically with respect to the impurity diffusion layer F1. The floating diffusion FD of the cell UC2 and the floating diffusion FD of the cell UC2" are arranged point-symmetrically with respect to the impurity diffusion layer F4.

The reset transistors Tc and the amplifying transistors Tb of the cells UC2, UC2', UC2" are arranged between the photodiodes PD1 to PD4 in the N-th column and the photodiodes PD1 to PD4 in the (N+1)-th column.

The floating diffusion FD is connected to the impurity diffusion layer F3 via a wire H11. The floating diffusion FD is connected to the gate electrode G15 via a wire H12. The impurity diffusion layer F2 is connected to the vertical signal line VL via a wire H13. The drain power source line HD is connected to the impurity diffusion layer F1.

The reset control line HS1 is connected to the gate electrode G10 of the cell UC2 and the reset control line HS2 is connected to the gate electrode G10 of the cell UC2'. The read control lines HR1 to HR4 are connected to the gate electrodes G11 to G14 respectively. A power source line VD is connected to the impurity diffusion layer F4. The power source line VD can supply the drain power source AVDD.

Incidentally, the read transistors Td1 to Td4, the reset transistor Tc, the floating diffusion FD, and the amplifying transistor Tb are arranged on the front side of the semiconductor substrate and the photodiodes PD1 to PD4 are arranged on the back side of the semiconductor substrate. For such a back-side illumination type, wires such as the reset control lines HS1, HS2, the read control lines HR1 to HR4, and the power source line VD can be arranged overlapping with the photodiodes PD1 to PD4 so that flexibility of the wire layout can be increased.

Incidentally, the photodiodes PD1 to PD4 may also be arranged on the front side of the semiconductor substrate together with the read transistors Td1 to Td4, the reset transistor Tc, the floating diffusion FD, and the amplifying transistor Tb. For such a front-side illumination type, wires such as the reset control lines HS1, HS2, the read control lines HR1 to HR4, and the power source line VD can be arranged while avoiding the photodiodes PD1 to PD4 so that the incidence of light into the photodiodes PD1 to PD4 is not prevented.

By separating the reset control lines HS1, HS2 between the cells UC2, UC2' adjacent to each other in the horizontal direction, the layout can be set so that parasitic capacitances between the floating diffusions FD are mutually equal even if the drain diffusion layer of the reset transistor Tc and the drain diffusion layer of the amplifying transistor Tb of the cell UC1 are made to be shared with adjacent cells.

(Fourth Embodiment)

Figure 10:
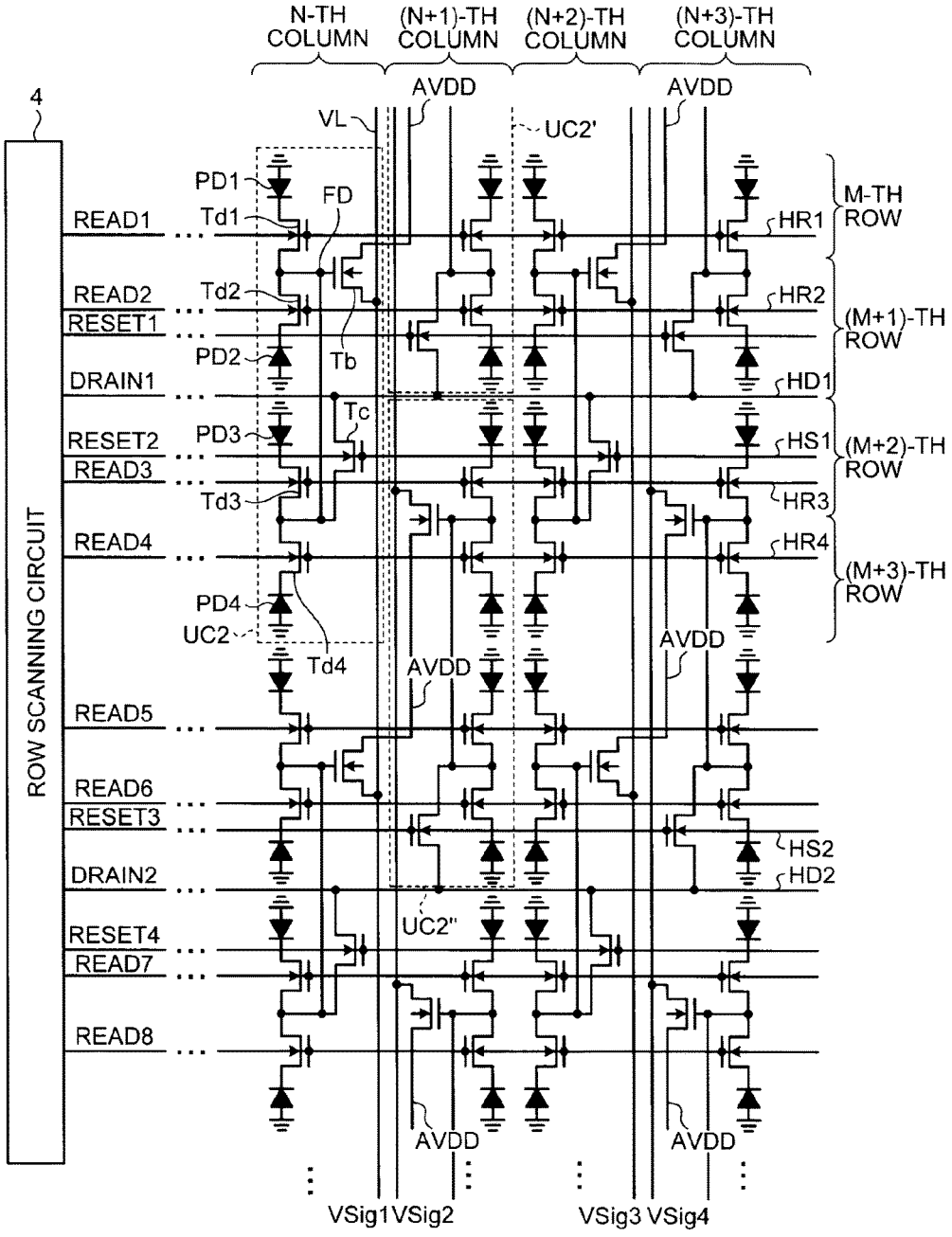
FIG. 10 is a block diagram illustrating the outline configuration of a solid state imaging apparatus according to a fourth embodiment.

FIG. 10 is a block diagram illustrating the outline configuration of a solid state imaging apparatus according to a fourth embodiment.

In FIG. 10, the solid state imaging apparatus has the cell UC2 arranged in a matrix form in the row direction and the column direction. The configuration of the cell UC2 in FIG. 10 is similar to the configuration of the cell UC2 in FIG. 7. However, the cell UC2' in the (N+1)-th column in FIG. 10 is arranged by being shifted upward in the vertical direction by two pixels with respect to the cell UC2 in the N-th column and the cell UC2" in the (N+1)-th column in FIG. 10 is arranged by being shifted downward in the vertical direction by two pixels with respect to the cell UC2 in the N-th column.

While the arrangement relationship between the reset transistor Tc and the amplifying transistor Tb in the vertical direction is mutually reversed in the cell UC2 in the N-th column and the cell UC2' in the (N+1)-th column in the solid state imaging apparatus in FIG. 7, the arrangement relationship between the reset transistor Tc and the amplifying transistor Tb in the vertical direction is mutually equal in the cell UC2 in the N-th column and the cell UC2' in the (N+1)-th column in the solid state imaging apparatus in FIG. 10.

In this solid state imaging apparatus, instead of the row scanning circuit 3 in FIG. 7, a row scanning circuit 4 is provided. The drain power source lines HD1, HD2, the reset control lines HS1, HS2, and the read control lines HR1 to HR4 are connected to the row scanning circuit 4. The row scanning circuit 4 can drive the drains of the reset transistors Tc in different rows separately. The row scanning circuit 4 can also drive the drain of the reset transistor Tc and the drain of the amplifying transistor Tb separately. If, for example, the drain of the reset transistor Tc is shared by four pixels adjacent to each other in the vertical direction, the drain of the reset transistor Tc can be driven for every four rows. The row scanning circuit 4 can drive the reset control line HS1 of the cell UC2 in the N-th column and the reset control line HS2 of the cell UC2" in the (N+1)-th column as a set.

Figure 11:
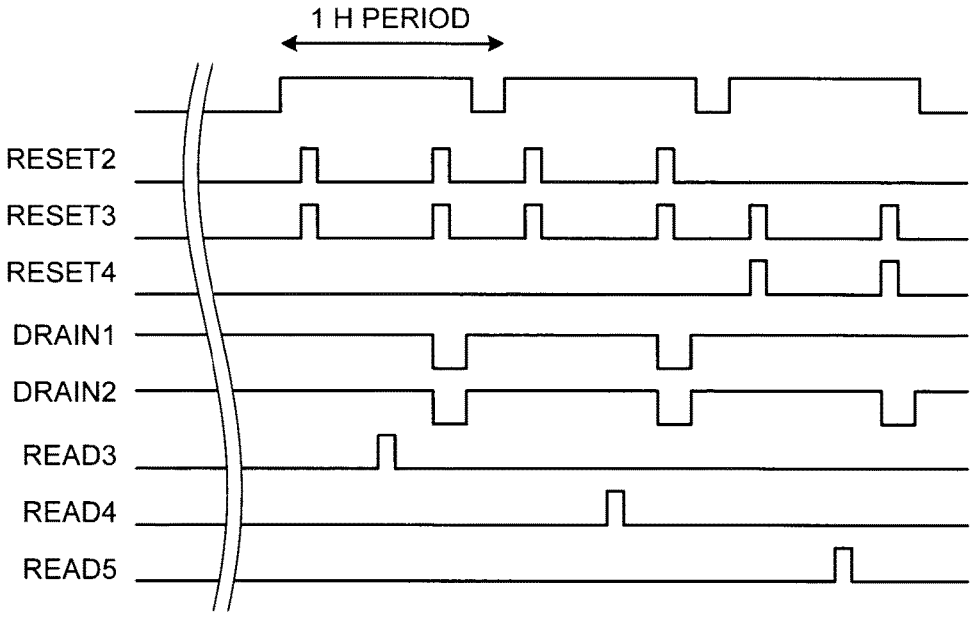
FIG. 11 is a timing chart illustrating the read operation of the solid state imaging apparatus in FIG. 10.

FIG. 11 is a timing chart illustrating the read operation of the solid state imaging apparatus in FIG. 10.

In FIG. 11, if, for example, a signal is to be read from a pixel in the N-th column and the (M+2)-th row, the reset transistor Tc of the cell UC2 is turned on and a charge of the floating diffusion FD of the cell UC2 is reset by the reset signal RESET2 being provided to the reset control line HS1. Then, with the voltage in accordance with the reset level of the floating diffusion FD of the cell UC2 being applied to the gate of the amplifying transistor Tb of the cell UC2 and the voltage applied to the gate of the amplifying transistor Tb of the cell UC2 being followed by the voltage of the vertical signal line VL in the N-th column, the pixel signal VSig1 of the reset level is output to the vertical signal line VL in the N-th column.

At this point, the reset transistor Tc of the cell UC2" is turned on and a charge of the floating diffusion FD of the cell UC2" is reset by the reset signal RESET3 being provided to the reset control line HS2. Then, with the voltage in accordance with the reset level of the floating diffusion FD of the cell UC2" being applied to the gate of the amplifying transistor Tb of the cell UC2" and the voltage applied to the gate of the amplifying transistor Tb of the cell UC2" being followed by the voltage of the vertical signal line VL in the (N+1)-th column, the pixel signal VSig2 of the reset level is output to the vertical signal line VL in the (N+1)-th column.

Next, the read transistor Td3 of the cell UC2 is turned on by the read signal READ3 being provided to the read control line HR3 and a charge detected by the photodiode PD3 of the cell UC2 is transferred to the floating diffusion FD of the cell UC2. Then, with the voltage in accordance with the signal level of the floating diffusion FD of the cell UC2 being applied to the gate of the amplifying transistor Tb of the cell UC2 and the voltage applied to the gate of the amplifying transistor Tb of the cell UC2 being followed by the voltage of the vertical signal line VL in the N-th column, the pixel signal VSig1 of the signal level is output to the vertical signal line VL in the N-th column.

Also, if the read signal READ3 is provided to the read control line HR3, the read transistor Td1 of the cell UC2" is turned on and a charge detected by the photodiode PD1 of the cell UC2" is transferred to the floating diffusion FD of the cell UC2". Then, with the voltage in accordance with the signal level of the floating diffusion FD of the cell UC2" being applied to the gate of the amplifying transistor Tb of the cell UC2" and the voltage applied to the gate of the amplifying transistor Tb of the cell UC2" being followed by the voltage of the vertical signal line VL in the (N+1)-th column, the pixel signal VSig2 of the signal level is output to the vertical signal line VL in the (N+1)-th column.

Next, the reset transistor Tc of the cells UC2 is turned on by the reset signal RESET2 being provided to the reset control line HS1. At this point, the potential of the floating diffusion FD of the cell UC2 is set to the L level by the drain pulse DRAIN1 being provided to the drain power source line HD1.

Also, the reset transistor Tc of the cell UC2" is turned on by the reset signal RESET3 being provided to the reset control line HS2. At this point, the potential of the floating diffusion FD of the cell UC2" is set to the L level by the drain pulse DRAIN2 being provided to the drain power source line HD2.

Hereafter, a similar operation is caused when signals are read from the next row.

Figure 12:
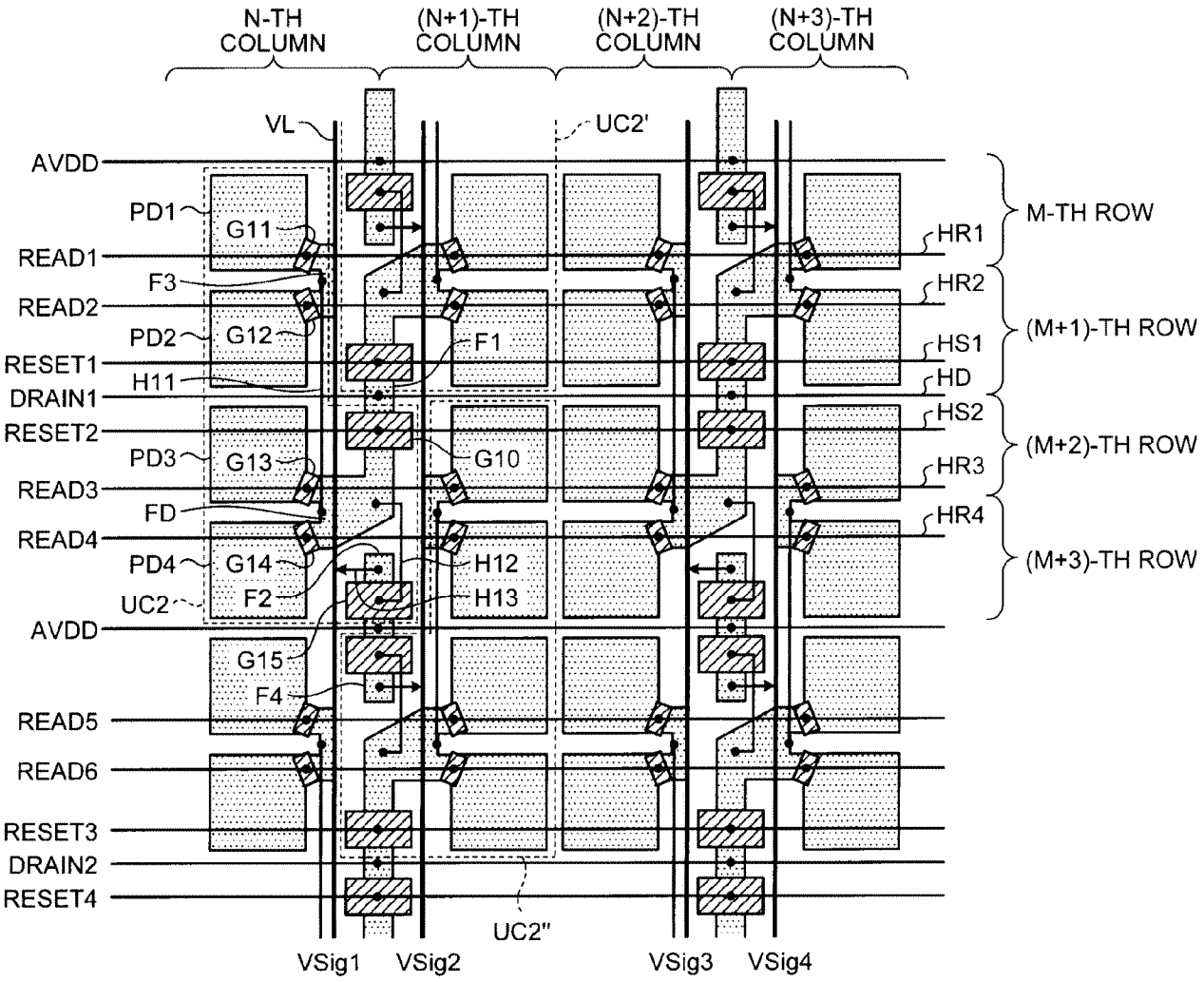
FIG. 12 is a plan view illustrating the layout configuration of a pixel array unit of the solid state imaging apparatus in FIG. 10.

FIG. 12 is a plan view illustrating the layout configuration of a pixel array unit of the solid state imaging apparatus in FIG. 10.

In FIG. 12, the layout configuration of the cell UC2 of the solid state imaging apparatus is similar to the layout configuration in FIG. 9. However, the cells UC2, UC2', UC2" are arranged in a staggered configuration by the wire H11 connecting the impurity diffusion layer F3 and the floating diffusion FD of the cell UC2 in the N-th column being shifted in the vertical direction by two rows in the (N+1)-th column.

Accordingly, the drain diffusion layer of the reset transistor Tc and the drain diffusion layer of the amplifying transistor Tb of the cell UC2 can be made to be shared with different adjacent cells while ensuring symmetry of the arrangement of the floating diffusion FD in the vertical direction and the horizontal direction also when the cells UC2, UC2', UC2" are arranged in a staggered configuration.

In the example of FIG. 12, the wire layout of a back-side illumination type CMOS sensor is taken as an example, but the present embodiment may also be applied to a front-side illumination type CMOS sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging apparatus, comprising:

a cell in which K (K is an integer equal to 2 or greater) pixels are provided;

an amplifying transistor that is shared by the K pixels and amplifies signals read from the pixels;

a reset transistor that is shared by the K pixels and resets the signals read from the pixels; and a row scanning circuit that drives a drain of the reset transistor separately between different rows while separating a drain power source of the reset transistor and the drain power source of the amplifying transistor, wherein a drain diffusion layer of the reset transistor [and the drain diffusion layer of the amplifying transistor are] *is* shared [by the different] *with the reset resistor of a first* adjacent [cells in a vertical direction] *cell, and a drain diffusion layer of the amplifying transistor is shared with the amplifying transistor of a second adjacent cell arranged in a vertical direction*.

2. The solid state imaging apparatus according to claim 1, wherein the cell is provided with two pixels arranged in a vertical direction and the cells are arranged in such a way that a mirror image is formed with respect to the cells adjacent to each other in the vertical direction.

3. The solid state imaging apparatus according to claim 2, wherein the cell in an odd column has the amplifying transistor and the reset transistor shifted by two pixels with respect to the cell in an even column.

4. The solid state imaging apparatus according to claim 1, wherein the cell is provided with four pixels arranged in a vertical direction and the cells in an odd column are arranged point-symmetrically with respect the cells in an even column.

5. The solid state imaging apparatus according to claim 4, wherein the cell is provided with the four pixels arranged in the vertical direction, a drain diffusion layer of the reset transistor of a first cell in the odd column and the drain diffusion layer of the reset transistor of a second cell in the even column adjacent to each other in a horizontal direction are shared and the drain diffusion layer of the amplifying transistor of the first cell and the drain diffusion layer of the amplifying transistor of a third cell in the even column adjacent to the second cell in the vertical direction are shared.

6. The solid state imaging apparatus according to claim 5, wherein the first cell is shifted by two pixels in the vertical direction with respect to the second cell.

7. The solid state imaging apparatus according to claim 1, further comprising: a floating diffusion provided corresponding to the reset transistor.

8. The solid state imaging apparatus according to claim 7, further comprising:

a photodiode that photoelectrically converts light from an object to be imaged in units of the pixels; and a read transistor that reads a signal photoelectrically converted by the photodiode in units of the pixels.

9. The solid state imaging apparatus according to claim 8, wherein the photodiodes are arranged side by side and adjacent to each other in a column direction in the cell.

10. The solid state imaging apparatus according to claim 1, wherein a first cell, a second cell, and a third cell are successively arranged adjacent to each other in a same row, the amplifying transistor of the second cell is arranged adjacent to the amplifying transistor of the first cell, and the reset transistor of the second cell is arranged adjacent to the reset transistor of the third cell.

11. The solid state imaging apparatus according to claim 1, wherein the amplifying transistor of a first cell in an N (N is a positive integer)-th column and the amplifying transistor of a second cell in an (N+1)-th column are arranged in an M-th row and the reset transistor of the first cell in the N-th column and the reset transistor of the second cell in the (N+1)-th column are arranged in an (M+1)-th row.

12. The solid state imaging apparatus according to claim 1, wherein the amplifying transistor of a first cell in an N (N is a positive integer)-th column and the reset transistor of a second cell in an (N+1)-th column are arranged in an M-th row and the reset transistor of the first cell in the N-th column and the amplifying transistor of the second cell in the (N+1)-th column are arranged in an (M+1)-th row.

13. The solid state imaging apparatus according to claim 1, wherein a second cell is arranged adjacent to a first cell in a same row, a third cell is arranged adjacent to the second cell in the same row, the reset transistor of the first cell is arranged adjacent to the reset transistor of the second cell, and the amplifying transistor of the first cell is arranged adjacent to the amplifying transistor of the third cell.

14. The solid state imaging apparatus according to claim 1, wherein the amplifying transistor of a first cell in an N (N is a positive integer)-th column is arranged in an (M (M is a positive integer)+3)-th row, the reset transistor of the first cell in the N-th column is arranged in an (M+2)-th row, the amplifying transistor of a second cell in an (N+1)-th column is arranged in an M-th row, and the reset transistor of the second cell in the (N+1)-th column is arranged in an (M+1)-th row.

15. The solid state imaging apparatus according to claim 1, wherein the cell is provided with two pixels arranged in an M (M is a positive integer)-th row and an (M+1)-th row, the reset transistor of the cell in an N (N is a positive integer)-th column and the reset transistor of the cell in an (N+1)-th column are provided in the M-th row, and the amplifying transistor of the cell in the N-th column and the amplifying transistor of the cell in the (N+1)-th column are provided in the (M+1)-th row.

16. The solid state imaging apparatus according to claim 1, wherein the cell is provided with two pixels arranged in an M (M is a positive integer)-th row and an (M+1)-th row, the reset transistor of the cell in an N (N is a positive integer)-th column and the amplifying transistor of the cell in an (N+1)-th column are provided in the M-th row, and the amplifying transistor of the cell in the N-th column and the reset transistor of the cell in the (N+1)-th column are provided in the (M+1)-th row.

17. The solid state imaging apparatus according to claim 1, wherein the cell is provided with four pixels arranged in an M (M is a positive integer)-th row, an (M+1)-th row, an (M+2)-th row, and an (M+3)-th row, the reset transistor of a first cell in an N (N is a positive integer)-th column is provided in the (M+2)-th row, the amplifying transistor of the first cell in the N-th column is provided in the (M+3)-th row, the reset transistor of a second cell in the (N+1)-th column is provided in the (M+1)-th row, and the amplifying transistor of the second cell in the (N+1)-th column is provided in the M-th row.

18. The solid state imaging apparatus according to claim 17, wherein the reset transistor of the first cell is arranged between the pixel in the (M+2)-th row of the first cell and the pixel in the (M+2)-th row of the second cell, the amplifying transistor of the first cell is arranged between the pixel in the (M+3)-th row of the first cell and the pixel in the (M+3)-th row of the second cell, the reset transistor of the second cell is arranged between the pixel in the (M+1)-th row of the first cell and the pixel in the (M+1)-th row of the second cell, and the amplifying transistor of the second cell is arranged between the pixel in the M-th row of the first cell and the pixel in the M-th row of the second cell.

19. The solid state imaging apparatus according to claim 17, wherein a third cell arranged in the (N+1)-th row is provided adjacent to the second cell, the reset transistor of the first cell is arranged between the pixel in the (M+2)-th row of the first cell and the pixel in the (M+2)-th row of the third cell, the amplifying transistor of the first cell is arranged between the pixel in the (M+3)-th row of the first cell and the pixel in the (M+3)-th row of the third cell, the reset transistor of the second cell is arranged between the pixel in the (M+1)-th row of the first cell and the pixel in the (M+1)-th row of the second cell, and the amplifying transistor of the second cell is arranged between the pixel in the M-th row of the first cell and the pixel in the M-th row of the second cell.

*20. A solid state imaging apparatus, comprising:*

*a cell in which K (K is an integer equal to 2 or greater) pixels are provided;*

*an amplifying transistor that is shared by the K pixels and amplifies signals read from the pixels;*

*a reset transistor that is shared by the K pixels and resets the signals read from the pixels; and*

*a row scanning circuit that drives a drain of the reset transistor while separating a drain power source of the reset transistor and a drain power source of the amplifying transistor,*

*wherein a drain diffusion layer of the reset transistor is shared with the reset transistor of a first adjacent cell, and*

*wherein a drain diffusion layer of the amplifying transistor is shared with the amplifying transistor of a second adjacent cell arranged in a vertical direction.*

*21. The apparatus according to claim 20, wherein the drain diffusion layer of the reset transistor and the drain diffusion layer of the amplifying transistor are arranged in the vertical direction.*

*22. The apparatus according to claim 21, wherein the drain diffusion layer of the reset transistor, the drain diffusion layer of the amplifying transistor and a source diffusion layer of the amplifying transistor are arranged in the vertical direction.*

*23. The apparatus according to claim 20, wherein the amplifying transistor has a current path in the vertical direction.*

*24. The apparatus according to claim 20, wherein the K pixels of the second adjacent cell are arranged line-symmetrically to the K pixels of the cell.*

*25. The apparatus according to claim 20, wherein the K pixels are arranged in the vertical direction, and wherein the reset transistor and the amplifying transistor are arranged between the K pixels and the first adjacent cell.*

*26. The apparatus according to claim 25, wherein K equals 2.*

*27. The apparatus according to claim 20, wherein the K pixels are arranged in the vertical direction and wherein the reset transistor and the amplifying transistor are arranged in the vertical direction and adjacent to the K pixels in a horizontal direction.*

*28. The apparatus according to claim 20, wherein each of the K pixels is coupled to a read transistor.*

*29. The apparatus according to claim 20, further comprising a third adjacent cell arranged in a horizontal direction relative to the cell, the third adjacent cell has K (K is an integer equal to 2 or greater) pixels, wherein the K pixels of the third adjacent cell are adjacent to the cell.*

*30. The apparatus according to claim 20, wherein the cell has a first floating diffusion layer and a second floating diffusion layer, the first floating diffusion layer electrically connected to the second floating diffusion layer,*

*wherein the K pixels have at least one first pixel and at least one second pixel,*

*wherein the first floating diffusion layer is connected to the at least one first pixel through a first read transistor, and*

*wherein the second floating diffusion layer is connected to the at least one second pixel through a second read transistor.*

*31. The apparatus according to claim 30, wherein the first floating diffusion layer and the second floating diffusion layer are commonly connected to the amplifying transistor and the reset transistor.*

*32. A solid state imaging apparatus, comprising:*

*a first cell in which K (K is an integer equal to 2 or greater) pixels are provided;*

*an amplifying transistor that is shared by the K pixels and amplifies signals read from the pixels;*

*a reset transistor that is shared by the K pixels and resets the signals read from the pixels; and*

*a row scanning circuit that drives a drain of the reset transistor separately between different rows while separating a drain power source of the reset transistor and the drain power source of the amplifying transistor, wherein*

*a drain diffusion layer of the amplifying transistor is shared by the amplifying transistor of a second cell which is adjacent to and arranged in a vertical direction relative to the first cell,*

*a drain diffusion layer of the reset transistor is shared by the reset transistor of a third cell which is adjacent to and arranged in a horizontal direction relative to the first cell, and*

*a fourth cell is arranged adjacent to and in a horizontal direction relative to the first cell.*

*33. The apparatus according to claim 32 wherein the first cell is a cell in which K (K is an integer equal to 2 or greater) pixels are provided.*

*34. The apparatus according to claim 33 wherein the pixels of the first cell and the second cell are arranged vertically.*

*35. The apparatus according to claim 32 wherein the second cell is a cell in which K (K is an integer equal to 2 or greater) pixels are provided.*

*36. The apparatus according to claim 35 wherein the pixels of the first cell and the second cell are arranged vertically.*

*37. The apparatus according to claim 32 wherein the fourth cell is a cell in which K (K is an integer equal to 2 or greater) pixels are provided.*

* * * * *